United States Patent
Hashizume

(10) Patent No.: US 10,665,479 B2
(45) Date of Patent: May 26, 2020

(54) SUBSTRATE TREATMENT DEVICE AND SUBSTRATE TREATMENT METHOD

(71) Applicant: SCREEN Holdings Co., Ltd., Kyoto (JP)

(72) Inventor: Akio Hashizume, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 25 days.

(21) Appl. No.: 16/062,661

(22) PCT Filed: Jan. 23, 2017

(86) PCT No.: PCT/JP2017/002107
§ 371 (c)(1),
(2) Date: Jun. 15, 2018

(87) PCT Pub. No.: WO2017/130897
PCT Pub. Date: Aug. 3, 2017

(65) Prior Publication Data
US 2018/0366350 A1    Dec. 20, 2018

(30) Foreign Application Priority Data

Jan. 25, 2016 (JP) .................. 2016-011885

(51) Int. Cl.
*H01L 21/67* (2006.01)
*B05B 15/70* (2018.01)
(Continued)

(52) U.S. Cl.
CPC ......... *H01L 21/67051* (2013.01); *B05B 1/32* (2013.01); *B05B 15/70* (2018.02);
(Continued)

(58) Field of Classification Search
CPC ................................. H01L 21/67051
See application file for complete search history.

(56) References Cited

U.S. PATENT DOCUMENTS

| 7,422,641 | B2 | 9/2008 | Nakajima et al. | 134/26 |
| 2003/0084925 | A1 | 5/2003 | Nakajima et al. | 134/26 |

(Continued)

FOREIGN PATENT DOCUMENTS

| JP | 2011-135014 A | 7/2011 |
| JP | 2012-182320 A | 9/2012 |

(Continued)

OTHER PUBLICATIONS

International Search report dated Feb. 21, 2017 in corresponding PCT International Application No. PCT/JP2017/002107.
(Continued)

*Primary Examiner* — Jason Y Ko
(74) *Attorney, Agent, or Firm* — Ostrolenk Faber LLP

(57) ABSTRACT

A substrate processing apparatus includes a rotating unit rotating a substrate around a predetermined first rotational axis passing through a central portion of a major surface of the substrate, a nozzle provided to be circumrotatable around a predetermined second rotational axis, discharging a processing fluid toward the major surface of the substrate, and having a plurality of discharge ports disposed at positions separated from the second rotational axis, a processing fluid supplying unit supplying the processing fluid to the plurality of discharge ports, and a nozzle moving unit moving the nozzle between a central portion processing position and a peripheral edge portion.

11 Claims, 10 Drawing Sheets

(51) Int. Cl.
*B05B 1/32* (2006.01)
*H01L 21/02* (2006.01)
*H01L 21/306* (2006.01)

(52) U.S. Cl.
CPC .. *H01L 21/02057* (2013.01); *H01L 21/30604* (2013.01); *H01L 21/6708* (2013.01); *H01L 21/67028* (2013.01)

(56) References Cited

U.S. PATENT DOCUMENTS

| | | | |
|---|---|---|---|
| 2003/0096562 A1* | 5/2003 | Kurogouchi | B24C 1/08 451/66 |
| 2012/0097097 A1 | 4/2012 | Ikushima | 118/300 |
| 2012/0222707 A1 | 9/2012 | Sato et al. | 134/33 |
| 2014/0093644 A1 | 4/2014 | Fujii | 427/240 |
| 2014/0227884 A1* | 8/2014 | Engesser | H01L 21/6708 438/747 |
| 2016/0027637 A1 | 1/2016 | Kim et al. | |

FOREIGN PATENT DOCUMENTS

| | | |
|---|---|---|
| JP | 2014-072234 A | 4/2014 |
| JP | 2014-072439 A | 4/2014 |
| JP | 2015-115491 A | 6/2015 |
| JP | 2016-32107 A | 3/2016 |
| TW | 583732 B | 4/2004 |
| TW | 201041660 A1 | 12/2010 |

OTHER PUBLICATIONS

Written Opinion dated Feb. 21, 2017 in corresponding PCT International Application No. PCT/JP2017/002107.

* cited by examiner

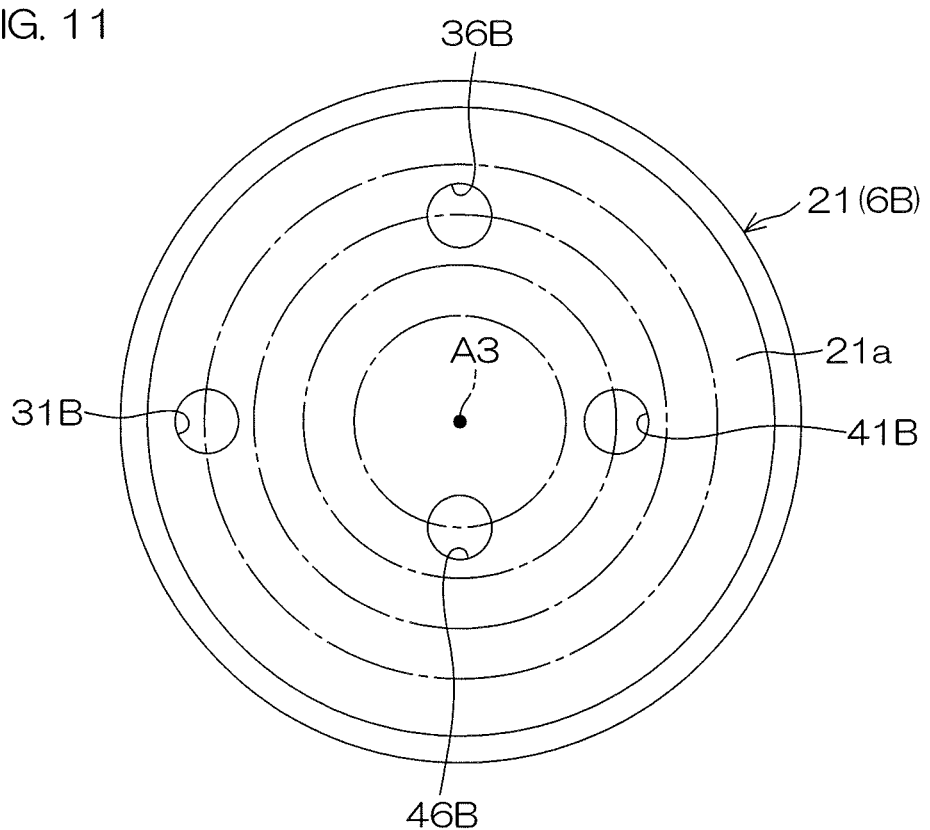

SUBSTRATE TREATMENT DEVICE AND SUBSTRATE TREATMENT METHOD

CROSS-REFERENCE TO RELATED APPLICATIONS

The present application is a 35 U.S.C. §§ 371 national phase conversion of PCT/JP2017/002107, filed Jan. 23, 2017, which claims priority to Japanese Patent Application No. 2016-011885, filed Jan. 25, 2016, the contents of both of which are incorporated herein by reference. The PCT International Application was published in the Japanese language.

TECHNICAL FIELD

In a manufacturing process for a semiconductor device or a liquid crystal display device, etc., a single substrate processing type substrate processing apparatus that processes substrates one by one is used at times to apply processing by a processing liquid on a major surface of a substrate, such as a semiconductor wafer, a glass substrate for liquid crystal display panel, etc.

The single substrate processing type substrate processing apparatus includes, for example, a spin chuck, arranged to rotate a substrate while holding it in a substantially horizontal posture, a nozzle, arranged to discharge a processing liquid toward a major surface of the substrate held by the spin chuck, a nozzle arm, supporting the nozzle, and a nozzle moving unit, moving the nozzle arm to move a liquid landing position of the processing liquid, discharged from the nozzle, along a predetermined locus passing through a rotation center of the substrate. If a plurality of processing liquids are to be used for substrate processing, a nozzle is provided in correspondence to each processing liquid.

It is desired that the number of nozzle arms be reduced to improve throughput, and thus arrangements where a single arm is made to hold discharge ports for mutually different processing liquids have been proposed from before as in the following Patent Literatures 1 and 2.

CITATION LIST

Patent Literatures

Patent Literature 1: Japanese Patent Application Publication No. 2014-072234

Patent Literature 2: Japanese Patent Application Publication No. 2014-072439

SUMMARY OF INVENTION

Technical Problem

When, as in Patent Literature 1 and Patent Literature 2, a single nozzle arm is made to hold a nozzle having a plurality of discharge ports, the plurality of discharge ports differ mutually in distance from a rotational axis in a state where the nozzle is disposed at a peripheral edge portion processing position of facing a peripheral edge portion of a major surface of a substrate. In this case, if the peripheral edge portion processing position of the nozzle is set such that a processing liquid discharged from one discharge port is discharged toward a peripheral edge region (a narrow region in a vicinity of a peripheral end edge) of the substrate, a supplying position of a processing liquid discharged from another discharge port may be deviated from the peripheral edge region. If the supplying position is deviated inward in a rotational radius direction with respect to the peripheral edge region, the peripheral edge region may not be processed.

Thus, an object of the present invention is to provide a substrate processing apparatus and a substrate processing method with which, regardless of which discharge port among a plurality of discharge ports of a nozzle a processing fluid is discharged from, the processing fluid discharged from the discharge port can be supplied satisfactorily to a peripheral edge portion of a major surface of a substrate.

Solution to Problem

The present invention provides a substrate processing apparatus that includes a substrate holding unit holding a substrate, a rotating unit rotating the substrate, held by the substrate holding unit around a predetermined first rotational axis passing through a central portion of a major surface of the substrate, a nozzle provided to be circumrotatable around a predetermined second rotational axis, discharging a processing fluid toward the major surface of the substrate, and having a plurality of discharge ports disposed at positions separated from the second rotational axis, a nozzle arm supporting the nozzle, a nozzle circumrotating unit making the nozzle circumrotate around the second rotational axis, a processing fluid supplying unit supplying the processing fluid to the plurality of discharge ports, and a nozzle moving unit moving the nozzle arm to move the nozzle between a central portion processing position, at which the processing fluid discharged from the nozzle is supplied to the central portion of the major surface of the substrate, and a peripheral edge portion processing position, at which the processing fluid discharged from the nozzle is supplied to the peripheral edge portion of the major surface of the substrate.

With the present arrangement, the nozzle having the plurality of discharge ports is moved between the central portion processing position and the peripheral edge portion processing position. Also, the nozzle is provided to be circumrotatable around the second rotational axis. For a desired discharge port among the plurality of discharge ports, a distance between the discharge port and the first rotational axis can be changed by making the nozzle circumrotate. Therefore, at the peripheral edge portion processing position of the nozzle, the desired discharge port among the plurality of discharge ports of the nozzle can be disposed such that the processing fluid discharged from the discharge port is supplied to the peripheral edge portion of the major surface of the substrate. Thereby, regardless of which discharge port among the plurality of discharge ports a processing fluid is discharged from, the processing fluid discharged from the discharge port can be supplied satisfactorily to the peripheral edge portion of the major surface of the substrate.

In the preferred embodiment of the present invention, the processing fluid supplying unit supplies processing fluids of mutually different types to the plurality of discharge ports.

With the present arrangement, the processing fluids of mutually different types are discharged from the plurality of discharge ports. At the peripheral edge portion processing position of the nozzle, the desired discharge port among the plurality of discharge ports can be disposed such that the processing fluid discharged from the discharge port is supplied to the peripheral edge portion of the major surface of the substrate. Therefore, regardless of which type of processing fluid is to be discharged from the nozzle, the processing fluid from the nozzle can be supplied satisfactorily to the peripheral edge portion of the major surface of the substrate.

The substrate processing apparatus may further include a first orientation controller, controlling a rotation direction orientation of the nozzle by the nozzle circumrotating unit in accordance with a type of processing fluid to be discharged from the nozzle.

With the present arrangement, the rotation direction orientation of the nozzle is controlled in accordance with the type of processing fluid to be discharged from the nozzle. In this case, the discharge port, from which the processing fluid to be discharged is discharged, can be disposed such that the processing fluid discharged from the discharge port is supplied to the peripheral edge portion of the major surface of the substrate. Thereby, even in a case where a plurality of types of processing fluids are to be discharged from the nozzle, the processing fluid to be discharged can be supplied satisfactorily to the peripheral edge portion of the major surface of the substrate.

The substrate processing apparatus may further include a second orientation controller, controlling the rotation direction orientation of the nozzle by the nozzle circumrotating unit such that at the peripheral edge portion processing position, a discharge port to be used for discharge among the plurality of discharge ports is disposed at a position at which it is separated further away from the second first rotational axis than the other discharge ports.

With the present arrangement, in a step in which a processing fluid is used, the rotation direction orientation of the nozzle is controlled to be a predetermined rotation direction orientation where, at the peripheral edge portion processing position of the nozzle, the discharge port to be used for discharge among the plurality of discharge ports is separated further away from the first rotational axis than the other discharge ports. Thereby, at the peripheral edge portion processing position of the nozzle, the desired discharge port among the plurality of discharge ports can be disposed such that the processing fluid discharged from the discharge port is supplied to the peripheral edge portion of the major surface of the substrate.

The plurality of discharge ports may be made mutually equal in distance from the second rotational axis.

With the present arrangement, at the peripheral edge portion processing position of the nozzle, a relative position with respect to the substrate of the discharge port to be used for discharge among the plurality of discharge ports can be kept at a constant position by making the nozzle circumrotate to change the rotation direction orientation of the nozzle. The processing fluid discharged from the discharge port can thereby be supplied with even higher precision to the peripheral edge portion of the major surface of the substrate.

Also, the plurality of discharge ports may be made mutually different in distance from the first rotational axis.

With the present arrangement, at the peripheral edge portion processing position of the nozzle, the discharge ports to be used for discharge among the plurality of discharge ports can be disposed at positions differing by just a minute amount.

The present invention is a substrate processing method that includes a step of preparing a nozzle, provided to be circumrotatable around a predetermined second rotational axis passing through a major surface of a substrate held by a substrate holding unit, discharging a processing fluid toward the major surface of the substrate, and having a plurality of discharge ports disposed at positions separated from the second rotational axis, a nozzle moving step of moving the nozzle along the major surface of the substrate between a central portion processing position of facing a central portion of the major surface of the substrate and a peripheral edge portion processing position of facing a peripheral edge portion of the major surface of the substrate, and an orientation controlling step of making the nozzle circumrotate around the second rotational axis to control a rotation direction orientation of the nozzle in accordance with a type of processing fluid to be discharged from the nozzle.

With the present method, in a step in which a processing fluid is used, the rotation direction orientation of the nozzle is controlled in accordance with the type of processing fluid to be discharged from the nozzle. In this case, the discharge port, from which the processing fluid to be discharged is discharged, can be disposed such that the processing fluid discharged from the discharge port is supplied to the peripheral edge portion of the major surface of the substrate. Thereby, regardless of which discharge port among the plurality of discharge ports of the nozzle a processing fluid is discharged from, the processing fluid discharged from the discharge port can be supplied satisfactorily to the peripheral edge portion of the major surface of the substrate.

The orientation controlling step may include a step of making the nozzle circumrotate around the second rotational axis to control the rotation direction orientation of the nozzle such that a discharge port to be used for discharge among the plurality of discharge ports is disposed at a position at which it is separated further away from a first rotational axis passing through the central portion of the major surface of the substrate, than the other discharge ports.

With the present method, in a step in which a processing fluid is used, the rotation direction orientation of the nozzle is controlled to be a predetermined rotation direction orientation where, at the peripheral edge portion processing position of the nozzle, the discharge port to be used for discharge among the plurality of discharge ports is separated further away from the first rotational axis than the other discharge ports. Thereby, at the peripheral edge portion processing position of the nozzle, the desired discharge port among the plurality of discharge ports can be disposed such that the processing fluid discharged from the discharge port is supplied to the peripheral edge portion of the major surface of the substrate.

The aforementioned and yet other objects, features, and effects of the present invention will be made clear by the following description of the preferred embodiment with reference to the attached drawings.

BRIEF DESCRIPTION OF DRAWINGS

FIG. 11 is a bottom view of a nozzle included in a substrate processing apparatus according to another preferred embodiment of the present invention.

DESCRIPTION OF EMBODIMENTS

Figure 1:
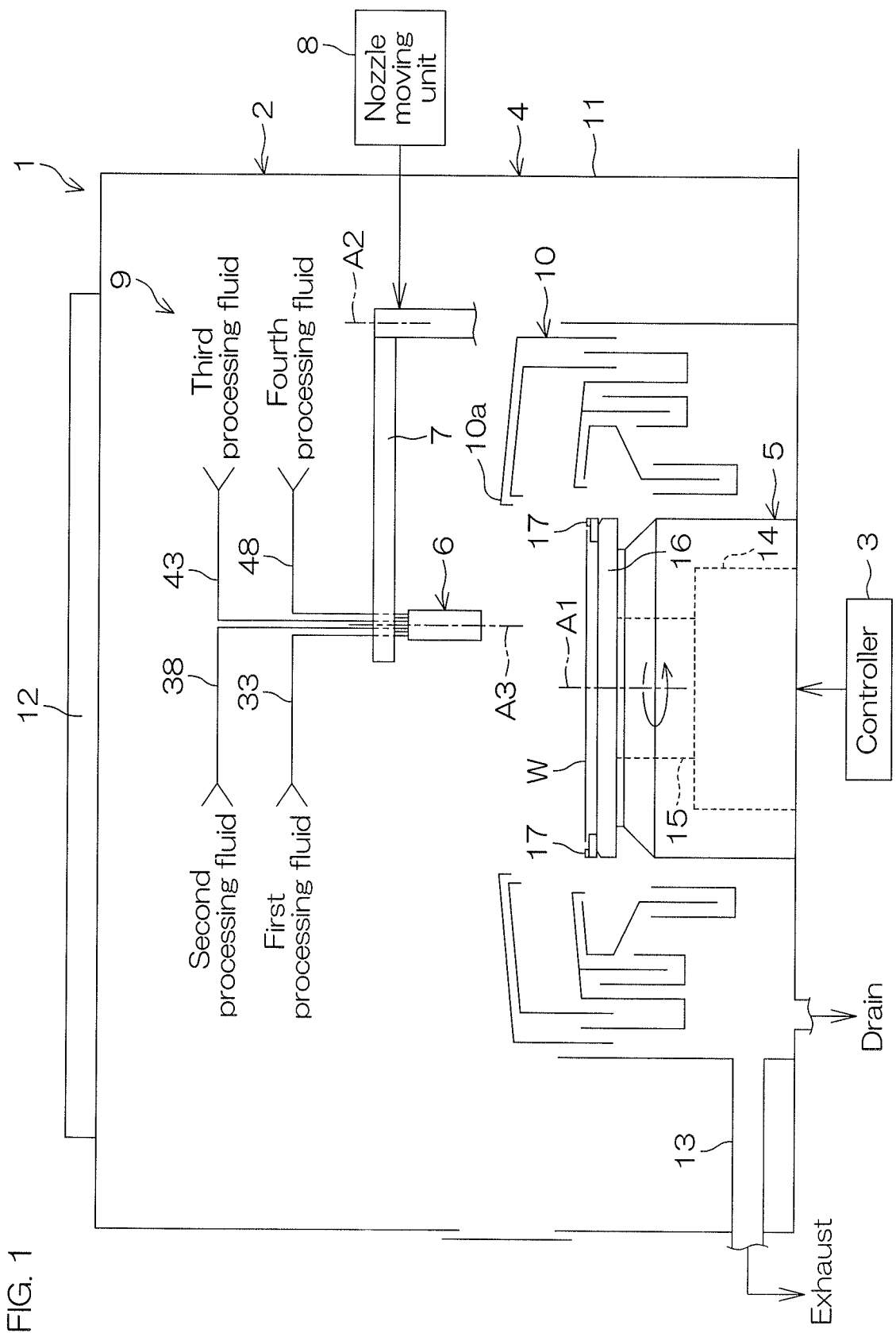
FIG. 1 is a view, viewed from a horizontal direction, of a substrate processing apparatus according to a preferred embodiment of the present invention.

FIG. 1 is a view, viewed from a horizontal direction, of a substrate processing apparatus 1 according to a preferred embodiment of the present invention.

The substrate processing apparatus 1 is a single substrate processing type apparatus that processes a disk-shaped substrate W, such as a semiconductor wafer, etc., one by one by processing fluids (processing liquids and processing gases). The substrate processing apparatus 1 includes a processing unit 2 that processes the substrate W using the processing fluids and a controller (first and second orientation controllers) 3 that controls operations of apparatuses and opening/closing of valves, etc., included in the substrate processing apparatus 1.

Each processing unit 2 is a single substrate processing type unit. Each processing unit 2 includes a box-shaped chamber 4, having an internal space, a spin chuck (substrate holding unit) 5, holding a single substrate W in a horizontal posture inside the chamber 4 and rotating the substrate W around a vertical rotational axis (first rotational axis) A1 passing through a center of the substrate W, a nozzle 6, arranged to supply the processing fluids to an upper surface (major surface) of the substrate W held by the spin chuck 5, a nozzle arm 7, supporting the nozzle 6, a nozzle moving unit 8, swinging (moving) the nozzle arm 7 around a vertical swinging axis A2 to move the nozzle 6 along the upper surface of the substrate W, a processing fluid supplying unit 9, supplying the processing fluids to the nozzle 6, and a cylindrical cup 10, surrounding a periphery of the spin chuck 5.

The chamber 4 includes a box-shaped partition wall 11, housing the spin chuck 5 and the nozzle 6, an FFU (Fan Filter Unit) 12, as a blower unit sending clean air (air filtered by a filter) into an interior of the partition wall 11 from an upper portion of the partition wall 11, and an exhaust duct 13, exhausting gas inside the chamber 4 from a lower portion of the partition wall 11. The FFU 12 is disposed above the partition wall 11 and is mounted on a ceiling of the partition wall 11. The FFU 12 sends the clean air into the chamber 4 from the ceiling of the partition wall 11. The exhaust duct 13 is connected to a bottom portion of the cup 10 and guides the gas inside the chamber 4 out toward exhaust processing equipment provided in a plant in which the substrate processing apparatus 1 is installed. A down flow (downward flow), flowing downward inside the chamber 4, is thus formed by the FFU 12 and the exhaust duct 13. The processing of the substrate W is performed in a state in which the down flow is formed inside the chamber 4.

As the spin chuck 5, a clamping type chuck, which clamps the substrate W in horizontal directions to hold the substrate W horizontally, is adopted. Specifically, the spin chuck 5 includes a spin motor (rotating unit) 14, a spin shaft 15, made integral to a driveshaft of the spin motor 14, and a disk-shaped spin base 16, mounted substantially horizontally on an upper end of the spin shaft 15.

A plurality (not less than three; for example, six) of clamping members 17 are disposed at a peripheral edge portion of an upper surface of the spin base 16. At the upper surface peripheral edge portion of the spin base 16, the plurality of clamping members 17 are disposed at suitable intervals on a circumference corresponding to an outer peripheral shape of the substrate W.

Also, the spin chuck 5 is not restricted to a clamping type and, for example, a vacuum suction type arrangement (vacuum chuck) that vacuum-suctions a rear surface of the substrate W to hold the substrate W in a horizontal posture and further performs rotation around a vertical rotational axis in this state to rotate the substrate W held by the spin chuck 5 may be adopted instead.

The nozzle 6 has a basic form of a scan nozzle capable of changing a supplying position of each processing fluid on the upper surface of the substrate W. The nozzle 6 is mounted to a tip portion of the nozzle arm 7. The nozzle arm 7 supports the nozzle 6 from above. The nozzle moving unit 8 swings the nozzle arm 7 around the swinging axis A2, extending vertically at a side of the cup 10, and can thereby horizontally move the supplying position of the processing fluid (liquid landing position of a processing liquid or blowing-on position of a processing gas) from the nozzle 6, disposed at a processing position, along an arcuate locus X passing through a central portion of the substrate W in plan view.

The nozzle moving unit 8 moves the nozzle 6 between the processing position, at which the processing fluid discharged from the nozzle 6 is supplied to the upper surface of the substrate W, and a home position, set at the periphery of the spin chuck 5 in plan view. Further, the nozzle moving unit 8 moves the nozzle 6 horizontally between a central portion processing position PC (position indicated by broken lines in FIG. 6 to FIG. 9; in other words, a position at which a rotational axis (second rotational axis) A3 of the nozzle 6 to be described below is substantially matched with the rotational axis A1), at which the processing fluid discharged from the nozzle 6 is supplied to the upper surface central portion of the substrate W (and a lower surface of the nozzle 6 (a lower surface 21a of a nozzle body 21) faces the central portion of the upper surface of the substrate W), and a peripheral edge portion processing position PE (position indicated by solid lines in FIG. 6 to FIG. 9), at which the processing fluid discharged from the nozzle 6 is supplied to a peripheral edge portion of the upper surface of the substrate W (and the lower surface of the nozzle 6 (the lower surface 21a of the nozzle body 21) faces the peripheral edge portion of the upper surface of the substrate W). The central portion processing position PC and the peripheral edge portion processing position PE are both processing positions.

Figure 2:
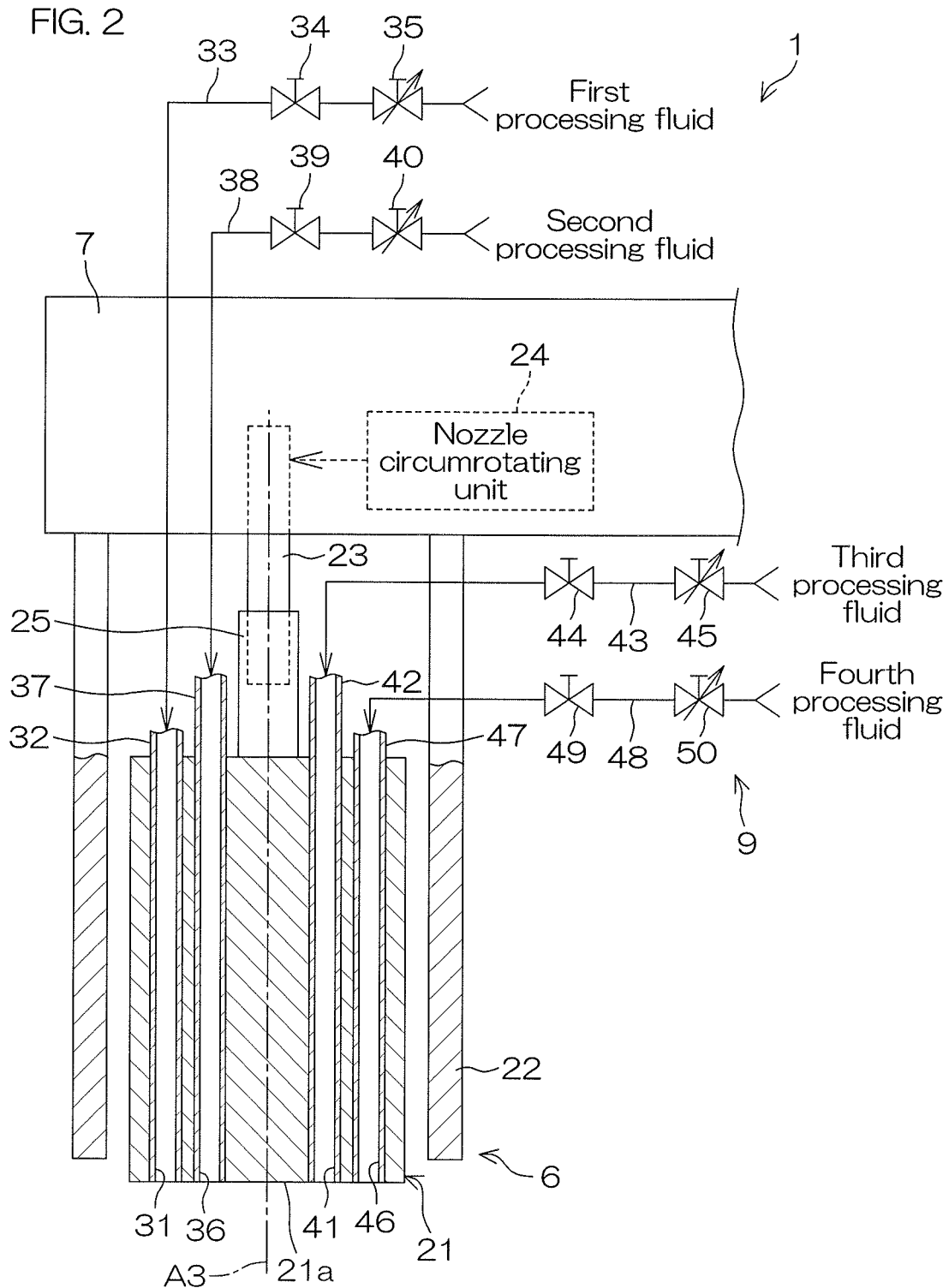
FIG. 2 is a sectional view of an arrangement of a periphery of a nozzle included in the substrate processing apparatus.
Figure 3:
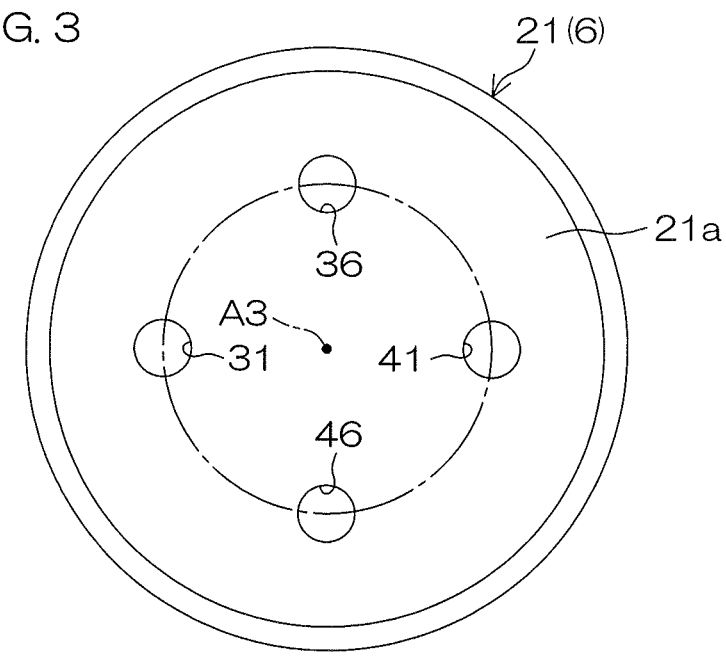
FIG. 3 is a bottom view of a nozzle body of the nozzle.

FIG. 2 is a sectional view of an arrangement of a periphery of the nozzle 6. FIG. 3 is a bottom view of the nozzle body 21 of the nozzle 6.

The nozzle 6 includes the nozzle body 21, having a first discharge port 31, a second discharge port 36, a third discharge port 41, and a fourth discharge port 46 (hereinafter, these discharge ports may be referred to collectively as the "discharge ports 31, 36, 41, and 46"), and a cylindrical cover 22, surrounding a side of the nozzle body 21. The nozzle body 21 is supported by the nozzle arm 7 such as to be circumrotatable around the rotational axis (second rotational axis) A3. On the other hand, the cover 22 is supported by the nozzle arm 7 in a stationary state.

The nozzle body 21 is arranged to have a form of an outer cylinder (a form of a circular column in the present preferred embodiment) that extends up and down. The respective discharge ports 31, 36, 41, and 46 are formed in the lower surface 21a of the nozzle body 21 and discharge the processing fluids vertically downward. As shown in FIG. 3, the plurality of discharge ports 31, 36, 41, and 46 are disposed at equal intervals in a circumferential direction. The plurality of discharge ports 31, 36, 41, and 46 are made mutually equal in distance from the rotational axis A3.

As shown in FIG. 2, at the tip portion of the nozzle arm 7, a nozzle rotating shaft 23, extending in a vertical direction, is provided such as to be rotatable around the rotational axis A3. A nozzle circumrotating unit 24, arranged to rotate the nozzle rotating shaft 23, is coupled to the nozzle rotating shaft 23. On the other hand, a holder 25 is mounted to the nozzle rotating shaft 23. The nozzle body 21 is mounted to a lower side of the holder 25.

A first processing fluid piping 32, a second processing fluid piping 37, a third processing fluid piping 42, and a fourth processing fluid piping 47 are inserted through an interior of the nozzle body 21. The first to fourth processing fluid pipings 32, 37, 42, and 47 extend in an up/down direction. An opening provided at a downstream end of the first processing fluid piping 32 forms the first discharge port 31. An opening provided at a downstream end of the second processing fluid piping 37 forms the second discharge port 36. An opening provided at a downstream end of the third processing fluid piping 42 forms the third discharge port 41. An opening provided at a downstream end of the fourth processing fluid piping 47 forms the fourth discharge port 46. That is, each of the first to fourth processing fluid pipings 32, 37, 42, and 47 has a function as a processing fluid nozzle.

As shown in FIG. 2, the processing fluid supplying unit 9 includes a first processing fluid supplying piping 33 connected to the first processing fluid piping 32, a second processing fluid supplying piping 38 connected to the second processing fluid piping 37, a third processing fluid supplying piping 43 connected to the third processing fluid piping 42, and a fourth processing fluid supplying piping 48 connected to the fourth processing fluid piping 47. Portions of the first to fourth processing fluid supplying pipings 33, 38, 43, and 48 connecting to the respectively corresponding first to fourth processing fluid pipings 32, 37, 42, and 47 are formed using flexible tubes. Circumrotation of the nozzle body 21 is thus allowed within a predetermined angular range. The nozzle body 21 (nozzle 6) can thus be changed in its rotation direction orientation.

In the first processing fluid supplying piping 33 is interposed a first processing fluid valve 34, arranged to open and close the first processing fluid supplying piping 33 to supply and stop the supply of a processing fluid to the first discharge port 31, and a first flow control valve 35, arranged to adjust an opening degree of the first processing fluid supplying piping 33 to adjust the flow rate of the processing fluid supplied to the first discharge port 31. Although not shown, the first flow control valve 35 includes a valve body, with a valve seat provided in an interior, a valve element, opening and closing the valve seat, and an actuator, moving the valve element between an open position and a closed position. The same applies to other flow control valves.

In the second processing fluid supplying piping 38 is interposed a second processing fluid valve 39, arranged to open and close the second processing fluid supplying piping 38 to supply and stop the supply of a processing fluid to the second discharge port 36, and a second flow control valve 40, arranged to adjust an opening degree of the second processing fluid supplying piping 38 to adjust the flow rate of the processing fluid supplied to the second discharge port 36. In the third processing fluid supplying piping 43 is interposed a third processing fluid valve 44, arranged to open and close the third processing fluid supplying piping 43 to supply and stop the supply of a processing fluid to the third discharge port 41, and a third flow control valve 45, arranged to adjust an opening degree of the third processing fluid supplying piping 43 to adjust the flow rate of the processing fluid supplied to the third discharge port 41. In the fourth processing fluid supplying piping 48 is interposed a fourth processing fluid valve 49, arranged to open and close the fourth processing fluid supplying piping 48 to supply and stop the supply of a processing fluid to the fourth discharge port 46, and a fourth flow control valve 50, arranged to adjust an opening degree of the fourth processing fluid supplying piping 48 to adjust the flow rate of the processing fluid supplied to the fourth discharge port 46.

A first processing fluid, a second processing fluid, a third processing fluid, and a fourth processing fluid are processing fluids of mutually different types. Each of these processing fluids is a processing liquid or a processing gas.

The processing liquid is a chemical liquid (cleaning chemical liquid or etching solution) or water. As the chemical liquid, a liquid containing at least one of sulfuric acid, acetic acid, nitric acid, hydrochloric acid, hydrofluoric acid, ammonia water, hydrogen peroxide water, an organic acid (such as citric acid, oxalic acid, etc.), an organic alkali (for example, TMPH: tetramethylammonium hydroxide, etc.), a surfactant, and a corrosion inhibitor can be cited as an example. The water is, for example, deionized water (DIW) but is not restricted to DIW and may be any of carbonated water, electrolyzed ion water, hydrogen water, ozone water, and aqueous hydrochloric acid solution of dilute concentration (for example of approximately 10 ppm to 100 ppm).

The processing gas includes an inert gas or a vapor of a processing liquid. As the inert gas, a gas containing at least one of nitrogen gas, argon gas, dry air, clean air, and helium gas can be cited as an example.

By opening the first processing fluid valve 34, the first processing fluid is discharged from the first discharge port 31. By closing the other processing fluid valves (the second to fourth processing fluid valves 39, 44, and 49) at this point, the first processing fluid can be discharged from the nozzle 6.

By opening the second processing fluid valve 39, the second processing fluid is discharged from the second discharge port 36. By closing the other processing fluid valves (the first, third, and fourth processing fluid valves 34, 44, and 49) at this point, the second processing fluid can be discharged from the nozzle 6.

By opening the third processing fluid valve 44, the third processing fluid is discharged from the third discharge port 41. By closing the other processing fluid valves (the first, second, and fourth processing fluid valves 34, 39, and 49) at this point, the third processing fluid can be discharged from the nozzle 6.

By opening the fourth processing fluid valve 49, the fourth processing fluid is discharged from the fourth discharge port 46. By closing the other processing fluid valves (the first, second, and third processing fluid valves 34, 39, and 44) at this point, the fourth processing fluid can be discharged from the nozzle 6.

The nozzle circumrotating unit 24 selects the rotation direction orientation of the nozzle body 21 in accordance with processing contents of respective processing steps (S3 to S8 and T3 to T9) described below. In the present preferred embodiment, the rotation direction orientation of the nozzle 6 in a single processing step (among S3 to S8 and T3 to T9) is kept constant without being changed.

Figure 8:
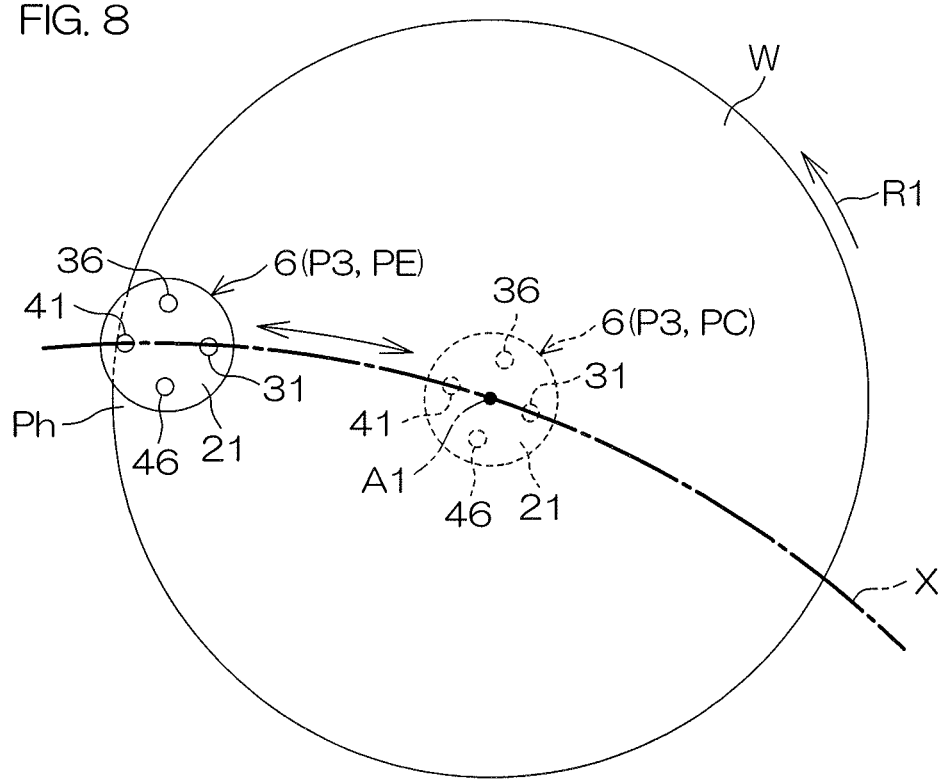
FIG. 8 is a plan view for describing the rotation direction orientation of the nozzle in a step in which a third processing fluid is used.
Figure 9:
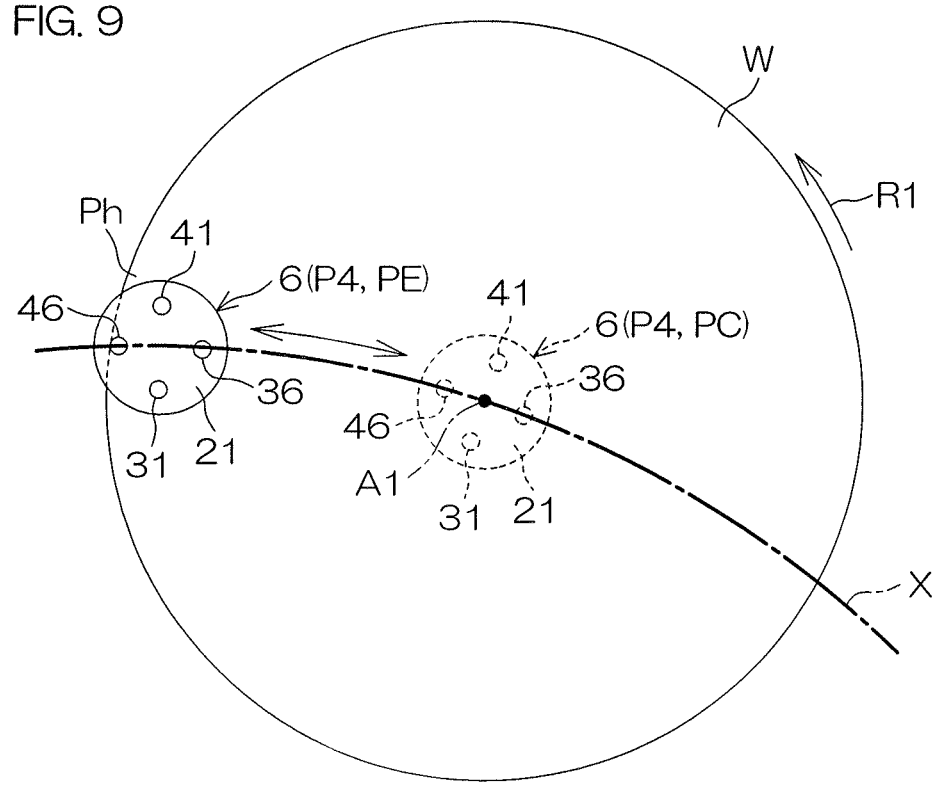
FIG. 9 is a plan view for describing the rotation direction orientation of the nozzle in a step in which a fourth processing fluid is used.

In the present preferred embodiment, the nozzle circumrotating unit 24 switches the rotation direction orientation of the nozzle 6 among a total of four orientations of a first orientation P1 (orientation shown in FIG. 6), a second orientation P2 (orientation shown in FIG. 7), a third orientation P3 (orientation shown in FIG. 8), and a fourth orientation P4 (orientation shown in FIG. 9). The first to fourth orientations P1 to P4 (hereinafter, the "orientations P1 to P4") are differed in phase by 90° each in a rotation direction around the rotational axis A3.

The first orientation P1 (orientation shown in FIG. 6) of the nozzle 6 is an orientation such that in a state where the nozzle 6 is disposed at the peripheral edge portion processing position PE, the first discharge port 31 is disposed at a position at which it is separated further away from the rotational axis A1 than the other discharge ports 36, 41, and 46. More specifically, it is furthermore an orientation such that in the state where the nozzle 6 is disposed at the peripheral edge portion processing position PE, the supplying position of the first processing fluid from the first discharge port 31 is positioned on the locus X. In a step in which the first processing fluid is discharged from the nozzle 6 (for example, an HF step (S3 or T3) to be described later), the nozzle 6 is in the first orientation P1 (orientation shown in FIG. 6).

The second orientation P2 (orientation shown in FIG. 7) of the nozzle 6 is an orientation such that in the state where the nozzle 6 is disposed at the peripheral edge portion processing position PE, the second discharge port 36 is disposed at a position at which it is separated further away from the rotational axis A1 than the other discharge ports 31, 41, and 46. More specifically, it is furthermore an orientation such that in the state where the nozzle 6 is disposed at the peripheral edge portion processing position PE, the supplying position of the second processing fluid from the second discharge port 36 is positioned on the locus X. In a step in which the second processing fluid is discharged from the nozzle 6 (for example, a rinsing step (S4, S6, T4, T6, or T8) to be described later), the nozzle 6 is in the second orientation P2 (orientation shown in FIG. 7).

The third orientation P3 (orientation shown in FIG. 8) of the nozzle 6 is an orientation such that in the state where the nozzle 6 is disposed at the peripheral edge portion processing position PE, the third discharge port 41 is disposed at a position at which it is separated further away from the rotational axis A1 than the other discharge ports 31, 36, and 46. More specifically, it is furthermore an orientation such that in the state where the nozzle 6 is disposed at the peripheral edge portion processing position PE, the supplying position of the third processing fluid from the third discharge port 41 is positioned on the locus X. In a step in which the third processing fluid is discharged from the nozzle 6 (for example, an SC1 step (S5 or T5) to be described later), the nozzle 6 is in the third orientation P3 (orientation shown in FIG. 8).

The fourth orientation P4 (orientation shown in FIG. 9) of the nozzle 6 is an orientation such that in the state where the nozzle 6 is disposed at the peripheral edge portion processing position PE, the fourth discharge port 46 is disposed at a position at which it is separated further away from the rotational axis A1 than the other discharge ports 31, 36, and 41. More specifically, it is furthermore an orientation such that in the state where the nozzle 6 is disposed at the peripheral edge portion processing position PE, the supplying position of the fourth processing fluid from the fourth discharge port 46 is positioned on the locus X. In a step in which the fourth processing fluid is discharged from the nozzle 6 (for example, a spin drying step (S6) or an SC2 step (T7) to be described later), the nozzle 6 is in the fourth orientation P4 (orientation shown in FIG. 9).

In the present preferred embodiment, the plurality of discharge ports 31, 36, 41, and 46 are made mutually equal in distance from the rotational axis A1 as mentioned above. Also, in each of the first to fourth orientations P1 to P4, the supplying position of the processing fluid discharged from the discharge port to be used for discharge is disposed at a position that is separated further away from the rotational axis A1 than the supplying positions of the processing fluids discharged from the other discharge ports and is on the locus X. That is, at the peripheral edge portion processing position PE of the nozzle 6, the supplying position of the processing fluid discharged from the discharge port to be used for discharge in each of the first to fourth orientations P1 to P4 is constant.

The cup 10 is disposed further outward (in a direction away from the rotational axis A1) than the substrate W held by the spin chuck 5. The cup 10 surrounds the spin base 16. When a processing liquid (a chemical liquid or a rinse liquid) is supplied as a processing fluid from the nozzle 6 to the substrate W in a state where the spin chuck 5 is rotating the substrate W, the processing liquid supplied to the substrate W is spun off to a periphery of the substrate W. When the processing liquid is supplied to the substrate W, an upper end portion 10a of the upwardly open cup 10 is disposed higher than the spin base 16. The processing liquid expelled to the periphery of the substrate W is thus received by the cup 10. The processing liquid received by the cup 10 is fed to an unillustrated recovery apparatus or waste liquid apparatus.

Figure 4:
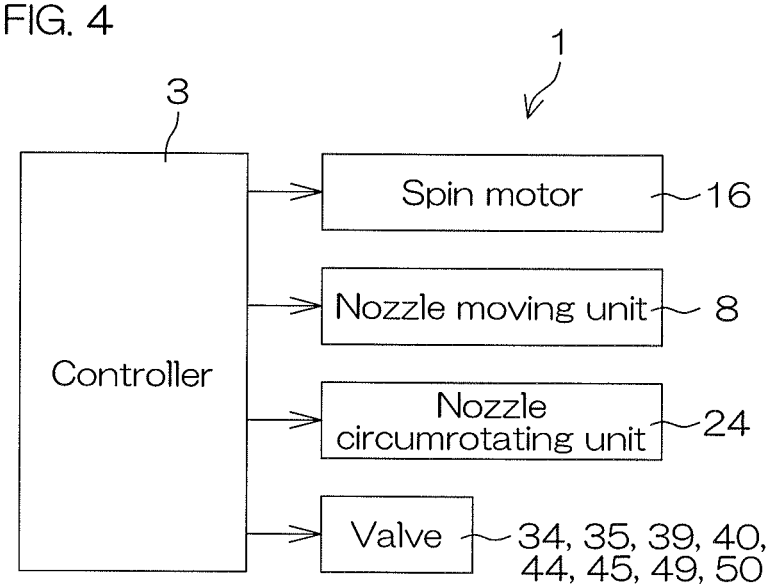
FIG. 4 is a block diagram for describing an electrical configuration of a main portion of the substrate processing apparatus.

FIG. 4 is a block diagram for describing an electrical configuration of a main portion of the substrate processing apparatus 1.

A controller 3 is arranged using, for example, a microcomputer. The controller 3 has a computing unit, such as CPU, etc., a storage unit, such as a fixed memory device, a hard disk drive, etc., and an input/output unit. A program executed by the computing unit is stored in the storage unit.

The controller 3 controls operations of the spin motor 14, the nozzle moving unit 8, the nozzle circumrotating unit 24, etc., in accordance with a predetermined program. Further, the controller 3 controls opening/closing operations of the first processing fluid valve 34, the second processing fluid valve 39, the third processing fluid valve 44, and the fourth processing fluid valve 49, and flow rate adjustment by the first flow control valve 35, the second flow control valve 40, the third flow control valve 45, and the fourth flow control valve 50.

Figure 5:
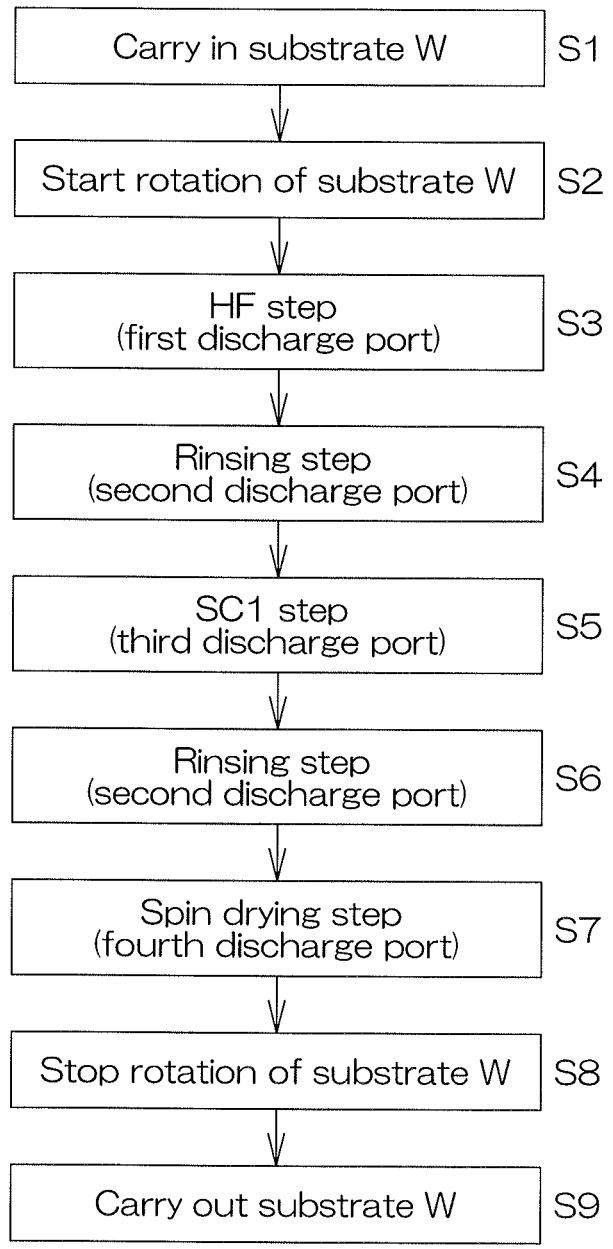
FIG. 5 is a flowchart for describing a first substrate processing example performed by the substrate processing apparatus.
Figure 6:
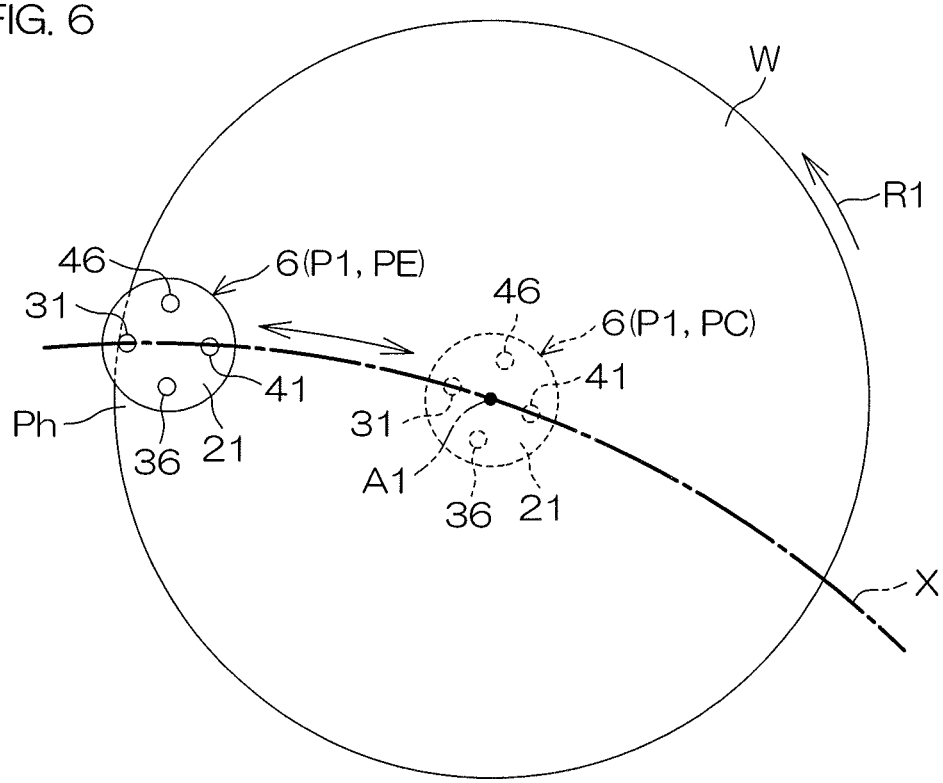
FIG. 6 is a plan view for describing a rotation direction orientation of the nozzle in a step in which a first processing fluid is used.
Figure 7:
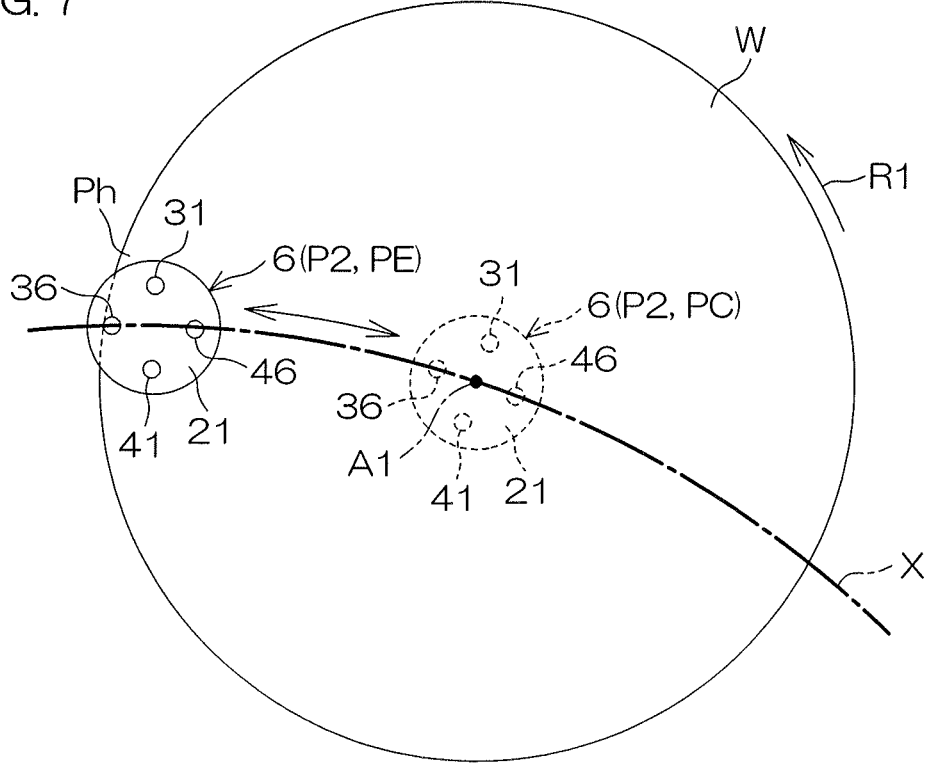
FIG. 7 is a plan view for describing the rotation direction orientation of the nozzle in a step in which a second processing fluid is used.

FIG. 5 is a flowchart for describing a first substrate processing example performed by the substrate processing apparatus 1. FIG. 6 is a plan view for describing the rotation direction orientation of the nozzle 6 (nozzle body 21) in the HF step (S3: step in which the first processing fluid is used). FIG. 7 is a plan view for describing the rotation direction orientation of the nozzle 6 (nozzle body 21) in the rinsing step (S4 or S6: step in which the second processing fluid is used). FIG. 8 is a plan view for describing the rotation direction orientation of the nozzle 6 (nozzle body 21) in the SC1 step (S5: step in which the third processing fluid is used). FIG. 9 is a plan view for describing the rotation direction orientation of the nozzle 6 (nozzle body 21) in the spin drying step (S7: step in which the fourth processing fluid is used).

The first substrate processing example shall now be described with reference to FIG. 1, FIG. 4, and FIG. 5. FIG. 6 to FIG. 9 shall be referenced where appropriate. The first substrate processing example is a cleaning processing.

In the first substrate processing example, as the processing fluids, hydrofluoric acid (dilute hydrofluoric acid) and SC1 (mixed liquid containing $NH_4OH$ and $H_2O_2$) as the cleaning chemical liquids, water as the rinse liquid, and nitrogen gas as the inert gas are used. Specifically, the processing fluid that is supplied from the first processing fluid supplying piping 33 to the first processing fluid piping and discharged from the first discharge port 31 is hydrofluoric acid. The processing fluid that is supplied from the second processing fluid supplying piping 38 to the second processing fluid piping 37 and discharged from the second discharge port 36 is water. The processing fluid that is supplied from the third processing fluid supplying piping 43 to the third processing fluid piping 42 and discharged from the third discharge port 41 is SC1. The processing fluid that is supplied from the fourth processing fluid supplying piping 48 to the fourth processing fluid piping 47 and discharged from the fourth discharge port 46 is nitrogen gas.

In the cleaning processing, an uncleaned substrate W is carried into an interior of the chamber 4 (step S1). Specifically, the controller 3 makes a hand (not shown) of a substrate transfer robot (not shown), which holds the substrate W, enter into the interior of the chamber 4 in a state where the nozzle 6 is disposed at a retreat position at which it is retreated from above the spin chuck 5. The substrate W is thereby passed onto the spin chuck 5 and held by the spin chuck 5 in a state where the major surface (surface to be processed; for example, a device forming surface), which is to be processed, is faced upward.

After the substrate W is held by the spin chuck 5, the controller 3 starts rotation of the substrate W in a rotation direction R1 by the spin motor 14 (step S2). The substrate W is raised to a predetermined liquid processing speed (of, for example, approximately 300 rpm) and maintained at the liquid processing speed.

Also, the controller 3 controls the nozzle moving unit 8 to move the nozzle 6 from the retreat position to a processing position mentioned above. The nozzle 6 is thereby disposed at the processing position.

Next, the HF step of supplying hydrofluoric acid (HF) to the upper surface of the substrate W is executed (step S3). Before executing the HF step (S3), the controller 3 controls the nozzle circumrotating unit 24 to control the rotation direction orientation of the nozzle 6 to be the first orientation P1 (orientation shown in FIG. 6) (orientation controlling step).

Specifically, to execute the HF step (S3), the controller 3 opens the first processing fluid valve 34. Hydrofluoric acid is thereby discharged from the first discharge port 31 of the nozzle 6 at a flow rate already adjusted by the first flow control valve 35. The hydrofluoric acid discharged from the nozzle 6 lands on the upper surface of the substrate W. Further, in the HF step (S3), the controller 3 controls the nozzle moving unit 8 to swing the nozzle arm 7 and move the nozzle 6 between the central portion processing position PC and the peripheral edge portion processing position PE. A liquid landing position of the hydrofluoric acid with respect to the upper surface of the substrate W is thereby moved along the locus X, between the central portion of the upper surface of the substrate W and the peripheral edge portion of the upper surface. Thus, the liquid landing position of the hydrofluoric acid passes through the entire upper surface of the substrate W, the entire upper surface of the substrate W is scanned, the hydrofluoric acid is supplied to the entire upper surface of the substrate W, and the entire upper surface of the substrate W is processed uniformly. When the nozzle 6 is disposed at the peripheral edge portion processing position PE, the first discharge port 31 faces the peripheral edge portion of the upper surface of the substrate W (in particular, a peripheral edge region Ph of several mm width from an outer peripheral end of the substrate W). In this state, the hydrofluoric acid discharged from the first discharge port 31 (the hydrofluoric acid discharged from the nozzle 6) lands on the peripheral edge portion of the upper surface of the substrate W (in particular, the peripheral edge region Ph of several mm width from the outer peripheral end of the substrate W).

When a predetermined period elapses from a start of discharge of the hydrofluoric acid, the controller 3 closes the first processing fluid valve 34 and stops the discharge of the hydrofluoric acid. The HF step (S3) is thereby ended.

Next, the rinsing step of supplying water as the rinse liquid to the upper surface of the substrate W is executed (step S4). Before executing the rinsing step (S4), the controller 3 controls the nozzle circumrotating unit 24 to control the rotation direction orientation of the nozzle 6 to be the second orientation P2 (orientation shown in FIG. 7) (orientation controlling step).

Specifically, to execute the rinsing step (S4), the controller 3 opens the second processing fluid valve 39. Water is thereby discharged from the second discharge port 36 of the nozzle 6 at a flow rate already adjusted by the second flow control valve 40. The water discharged from the nozzle 6 lands on the upper surface of the substrate W. Further, in the rinsing step (S4), the controller 3 controls the nozzle moving unit 8 to swing the nozzle arm 7 and move the nozzle 6 between the central portion processing position PC and the peripheral edge portion processing position PE. A liquid landing position of the water with respect to the upper surface of the substrate W is thereby moved along the locus X, between the central portion of the upper surface of the substrate W and the peripheral edge portion of the upper surface. Thus, the liquid landing position of the water passes through the entire upper surface of the substrate W, the entire upper surface of the substrate W is scanned, the water is supplied to the entire upper surface of the substrate W, and the hydrofluoric acid is replaced by the water across the entire upper surface of the substrate W. When the nozzle 6 is disposed at the peripheral edge portion processing position PE, the second discharge port 36 faces the peripheral edge portion of the upper surface of the substrate W (in particular, the peripheral edge region Ph of several mm width from the outer peripheral end of the substrate W). In this state, the water discharged from the second discharge port 36 (the water discharged from the nozzle 6) lands on the peripheral edge portion of the upper surface of the substrate W (in particular, the peripheral edge region Ph of several mm width from the outer peripheral end of the substrate W).

When a predetermined period elapses from a start of discharge of the water, the controller 3 closes the second processing fluid valve 39 and stops the discharge of the water. The rinsing step (S4) is thereby ended.

Next, the SC1 step of supplying SC1 to the upper surface of the substrate W is executed (step S5). Before executing the SC1 step (S5), the controller 3 controls the nozzle circumrotating unit 24 to control the rotation direction orientation of the nozzle 6 to be the third orientation P3 (orientation shown in FIG. 8) (orientation controlling step).

Specifically, to execute the SC1 step (S5), the controller 3 opens the third processing fluid valve 44. SC1 is thereby discharged from the third discharge port 41 of the nozzle 6 at a flow rate already adjusted by the third flow control valve 45. The SC1 discharged from the nozzle 6 lands on the upper surface of the substrate W. Further, in the SC1 step (S5), the controller 3 controls the nozzle moving unit 8 to swing the nozzle arm 7 and move the nozzle 6 between the central portion processing position PC and the peripheral edge portion processing position PE. A liquid landing position of the SC1 with respect to the upper surface of the substrate W is thereby moved along the locus X, between the central portion of the upper surface of the substrate W and the peripheral edge portion of the upper surface. Thus, the liquid landing position of the SC1 passes through the entire upper surface of the substrate W, the entire upper surface of the substrate W is scanned, the SC1 is supplied to the entire upper surface of the substrate W, and the entire upper surface of the substrate W is processed uniformly. When the nozzle 6 is disposed at the peripheral edge portion processing position PE, the third discharge port 41 faces the peripheral edge portion of the upper surface of the substrate W (in particular, the peripheral edge region Ph of several mm width from the outer peripheral end of the substrate W). In this state, the SC1 discharged from the third discharge port 41 (the SC1 discharged from the nozzle 6) lands on the peripheral edge portion of the upper surface of the substrate W (in particular, the peripheral edge region Ph of several mm width from the outer peripheral end of the substrate W).

When a predetermined period elapses from a start of discharge of the SC1, the controller 3 closes the third processing fluid valve 44 and stops the discharge of the SC1. The SC1 step (S5) is thereby ended.

Next, the rinsing step of supplying water as the rinse liquid to the upper surface of the substrate W is executed (step S6). Before executing the rinsing step (S6), the controller 3 controls the nozzle circumrotating unit 24 to control the rotation direction orientation of the nozzle 6 to be the second orientation P2 (orientation shown in FIG. 7).

Specifically, to execute the rinsing step (S6), the controller 3 opens the second processing fluid valve 39. Water is thereby discharged from the second discharge port 36 of the nozzle 6 at a flow rate already adjusted by the second flow control valve 40. The water discharged from the nozzle 6 lands on the upper surface of the substrate W. Further, in the rinsing step (S6), the controller 3 controls the nozzle moving unit 8 to swing the nozzle arm 7 and move the nozzle 6 between the central portion processing position PC and the peripheral edge portion processing position PE. The liquid landing position of the water with respect to the upper surface of the substrate W is thereby moved along the locus X, between the central portion of the upper surface of the substrate W and the peripheral edge portion of the upper surface. Thus, the liquid landing position of the water passes through the entire upper surface of the substrate W, the entire upper surface of the substrate W is scanned, the water is supplied to the entire upper surface of the substrate W, and the SC1 is replaced by the water across the entire upper surface of the substrate W. When the nozzle 6 is disposed at the peripheral edge portion processing position PE, the second discharge port 36 faces the peripheral edge portion of the upper surface of the substrate W (in particular, the peripheral edge region Ph of several mm width from the outer peripheral end of the substrate W). In this state, the water discharged from the second discharge port (the water discharged from the nozzle 6) lands on the peripheral edge portion of the upper surface of the substrate W (in particular, the peripheral edge region Ph of several mm width from the outer peripheral end of the substrate W).

When a predetermined period elapses from the start of discharge of the water, the controller 3 closes the second processing fluid valve 39 and stops the discharge of the water. The rinsing step (S6) is thereby ended.

Next, the spin drying step (step S7) of spinning off the substrate W and drying it is executed. Before executing the spin drying step (S7), the controller 3 controls the nozzle circumrotating unit 24 to control the rotation direction orientation of the nozzle 6 to be the fourth orientation P4 (orientation shown in FIG. 9) (orientation controlling step).

Specifically, to execute the spin drying step (S7), the controller 3 controls the spin motor 14 to accelerate the substrate W to a drying rotational speed (of, for example, several thousand rpm) and maintain the rotation of the substrate W at the drying rotational speed. A large centrifugal force is thereby applied to the liquid on the substrate W and the liquid attached to the substrate W is spun off to the periphery of the substrate W. Also, in parallel to executing the spin drying step (S7), the controller 3 discharges nitrogen gas onto the upper surface of the substrate W to promote the drying of the substrate W. Specifically, the controller 3 opens the fourth processing fluid valve 49. Nitrogen gas is thereby discharged from the fourth discharge port 46 of the nozzle 6 at a flow rate already adjusted by the fourth flow control valve 50. The nitrogen gas discharged from the nozzle 6 is blown onto the upper surface of the substrate W. Further, in the spin drying step (S7), the controller 3 controls the nozzle moving unit 8 to swing the nozzle arm 7 and move the nozzle 6 between the central portion processing position PC and the peripheral edge portion processing position PE. A blowing-on position of the nitrogen gas with respect to the upper surface of the substrate W is thereby moved along the locus X, between the central portion of the upper surface of the substrate W and the peripheral edge portion of the upper surface. Thus, the blowing-on position of the nitrogen gas passes through the entire upper surface of the substrate W, the entire upper surface of the substrate W is scanned, the nitrogen gas is supplied to the entire upper surface of the substrate W, and drying is promoted across the entire upper surface of the substrate W. When the nozzle 6 is disposed at the peripheral edge portion processing position PE, the fourth discharge port 46 faces the peripheral edge portion of the upper surface of the substrate W (in particular, the peripheral edge region Ph of several mm width from the outer peripheral end of the substrate W). In this state, the nitrogen gas discharged from the fourth discharge port 46 (the nitrogen gas discharged from the nozzle 6) lands on the peripheral edge portion of the upper surface of the substrate W (in particular, the peripheral edge region Ph of several mm width from the outer peripheral end of the substrate W).

When the spin drying step (S7) has been performed for a predetermined period, the controller 3 controls the spin motor 14 to stop the rotation of the spin chuck 5 (rotation of the substrate W) (step S8). The processing (cleaning processing) of the single substrate W is thereby ended and the processed substrate W is carried out from the chamber 4 by the transfer robot (step S9).

Figure 10:
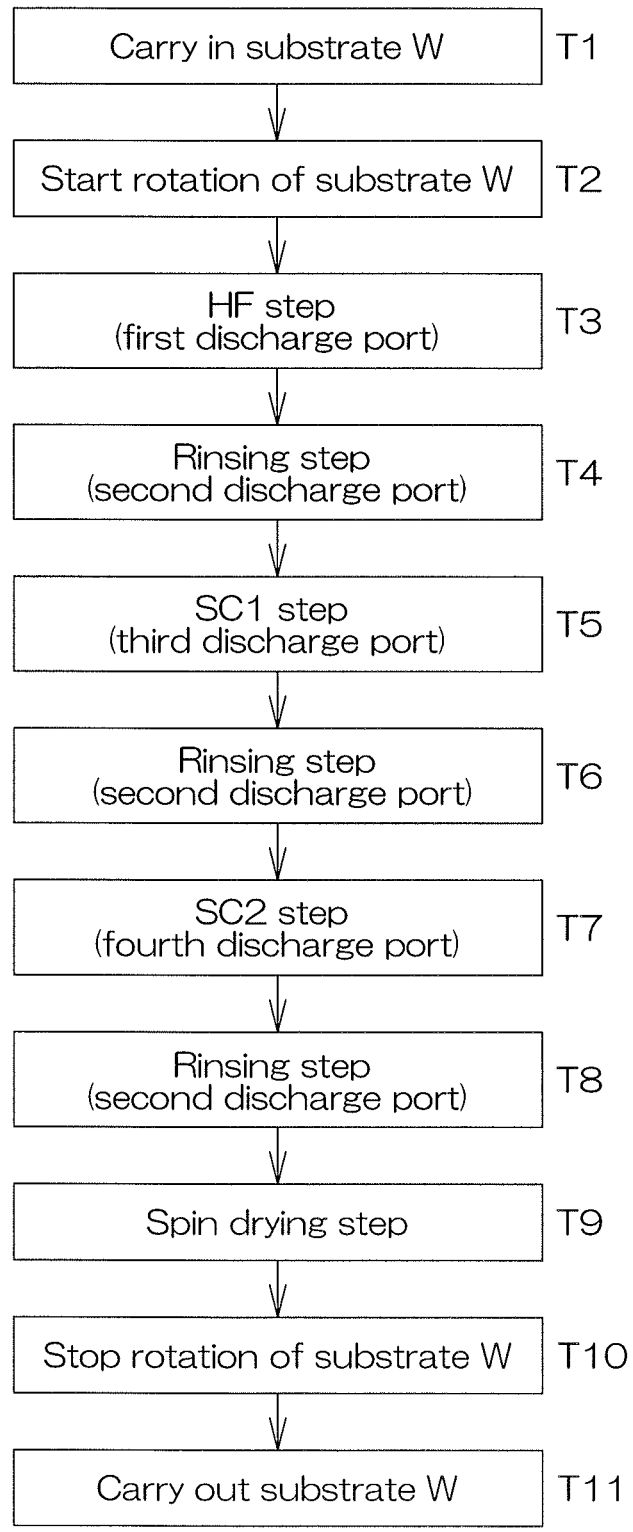
FIG. 10 is a flowchart for describing a second substrate processing example performed by the substrate processing apparatus.

FIG. 10 is a flowchart for describing a second substrate processing example performed by the substrate processing apparatus 1. The second substrate processing example shall now be described with reference to FIG. 10, FIG. 4, and FIG. 5. FIG. 6 to FIG. 9 shall be referenced where appropriate. The second substrate processing example is a cleaning processing.

In the second substrate processing example, as the processing fluids, hydrofluoric acid (dilute hydrofluoric acid), SC1, and SC2 (mixed liquid containing HCl and $H_2O_2$) as the cleaning chemical liquids and water as the rinse liquid are used. Specifically, the processing fluid that is supplied from the first processing fluid supplying piping 33 to the first processing fluid piping 32 and discharged from the first discharge port 31 is hydrofluoric acid. The processing fluid that is supplied from the second processing fluid supplying piping 38 to the second processing fluid piping 37 and discharged from the second discharge port 36 is water. The processing fluid that is supplied from the third processing fluid supplying piping 43 to the third processing fluid piping 42 and discharged from the third discharge port 41 is SC1. The processing fluid that is supplied from the fourth processing fluid supplying piping 48 to the fourth processing fluid piping 47 and discharged from the fourth discharge port 46 is SC2.

In the cleaning processing, an uncleaned substrate W is carried into the interior of the chamber 4 (step T1). The substrate W is thereby passed onto the spin chuck 5 and held by the spin chuck 5 in the state where the major surface (surface to be processed; for example, the device forming surface), which is to be processed, is faced upward.

After the substrate is held by the spin chuck 5, the controller 3 starts rotation of the substrate W in the rotation direction R1 by the spin motor 14 (step T2).

Also, the controller 3 controls the nozzle moving unit 8 to move the nozzle 6 from the retreat position to a processing position mentioned above. The nozzle 6 is thereby disposed at the processing position.

Next, the HF step of supplying hydrofluoric acid (HF) to the upper surface of the substrate W is executed (step T3). Before executing the HF step (T3), the controller 3 controls the nozzle circumrotating unit 24 to control the rotation direction orientation of the nozzle 6 to be the first orientation P1 (orientation shown in FIG. 6).

After the HF step (T3) is ended, the rinsing step of supplying water as the rinse liquid to the upper surface of the substrate W is executed (step T4). Before executing the rinsing step (T4), the controller 3 controls the nozzle circumrotating unit 24 to control the rotation direction orientation of the nozzle 6 to be the second orientation P2 (orientation shown in FIG. 7).

After the rinsing step (T4) is ended, the SC1 step of supplying SC1 to the upper surface of the substrate W is executed (step T5). Before executing the SC1 step (T5), the controller 3 controls the nozzle circumrotating unit 24 to control the rotation direction orientation of the nozzle 6 to be the third orientation P3 (orientation shown in FIG. 8).

After the SC1 step (T5) is ended, the rinsing step of supplying water as the rinse liquid to the upper surface of the substrate W is executed (step T6). Before executing the rinsing step (T6), the controller 3 controls the nozzle circumrotating unit 24 to control the rotation direction orientation of the nozzle 6 to be the second orientation P2 (orientation shown in FIG. 7).

Among respective steps of the second substrate processing example shown in FIG. 10, the steps T1 to T6 are steps equivalent to steps S1 to S6 of the first substrate processing example shown in FIG. 5 and therefore description thereof shall be omitted.

Next, the SC2 step of supplying SC2 to the upper surface of the substrate W is executed (step T7). Before executing the SC2 step (T7), the controller 3 controls the nozzle circumrotating unit 24 to control the rotation direction orientation of the nozzle 6 to be the fourth orientation P4 (orientation shown in FIG. 9) (orientation controlling step). The fourth discharge port 46 is thereby separated further away from the rotational axis A1 than the other discharge ports 31, 36, and 41 and disposed at a position on the locus X.

Specifically, to execute the SC2 step (T7), the controller 3 opens the fourth processing fluid valve 49. SC2 is thereby discharged from the fourth discharge port 46 of the nozzle 6 at a flow rate already adjusted by the fourth flow control valve 50. The SC2 discharged from the nozzle 6 lands on the upper surface of the substrate W. Further, in the SC2 step (T7), the controller 3 controls the nozzle moving unit 8 to swing the nozzle arm 7 and move the nozzle 6 between the central portion processing position PC and the peripheral edge portion processing position PE. A liquid landing position of the SC2 with respect to the upper surface of the substrate W is thereby moved along the locus X, between the central portion of the upper surface of the substrate W and the peripheral edge portion of the upper surface. Thus, the liquid landing position of the SC2 passes through the entire upper surface of the substrate W, the entire upper surface of the substrate W is scanned, the SC2 is supplied to the entire upper surface of the substrate W, and the entire upper surface of the substrate W is processed uniformly. When the nozzle 6 is disposed at the peripheral edge portion processing position PE, the fourth discharge port 46 faces the peripheral edge portion of the upper surface of the substrate W (in particular, the peripheral edge region Ph of several mm width from the outer peripheral end of the substrate W). In this state, the SC2 discharged from the fourth discharge port 46 (the SC2 discharged from the nozzle 6) lands on the peripheral edge portion of the upper surface of the substrate W (in particular, the peripheral edge region Ph of several mm width from the outer peripheral end of the substrate W).

When a predetermined period elapses from a start of discharge of the SC2, the controller 3 closes the fourth processing fluid valve 49 and stops the discharge of the SC2. The SC2 step (T7) is thereby ended.

Next, the rinsing step of supplying water as the rinse liquid to the upper surface of the substrate W is executed (step T8). Before executing the rinsing step (T8), the controller 3 controls the nozzle circumrotating unit 24 to control the rotation direction orientation of the nozzle 6 to be the second orientation P2 (orientation shown in FIG. 7).

Specifically, to execute the rinsing step (T8), the controller 3 opens the second processing fluid valve 39. Water is thereby discharged from the second discharge port 36 of the nozzle 6 at a flow rate already adjusted by the second flow control valve 40. The water discharged from the nozzle 6 lands on the upper surface of the substrate W. Further, in the rinsing step (T8), the controller 3 controls the nozzle moving unit 8 to swing the nozzle arm 7 and move the nozzle 6 between the central portion processing position PC and the peripheral edge portion processing position PE. The liquid landing position of the water with respect to the upper surface of the substrate W is thereby moved along the locus X, between the central portion of the upper surface of the substrate W and the peripheral edge portion of the upper surface. Thus, the liquid landing position of the water passes through the entire upper surface of the substrate W, the entire upper surface of the substrate W is scanned, the water is supplied to the entire upper surface of the substrate W, and the SC2 is replaced by the water across the entire upper surface of the substrate W.

When a predetermined period elapses from the start of discharge of the water, the controller 3 closes the second processing fluid valve 39 and stops the discharge of the water. The rinsing step (T8) is thereby ended.

Next, the spin drying step (step T9) of spinning off the substrate W and drying it is executed. Specifically, the controller 3 controls the spin motor 14 to accelerate the substrate W to the drying rotational speed (of, for example, several thousand rpm) and maintain the rotation of the substrate W at the drying rotational speed. A large centrifugal force is thereby applied to the liquid on the substrate W and the liquid attached to the substrate W is spun off to the periphery of the substrate W and the substrate W is thereby dried.

When the spin drying step (T9) has been performed for a predetermined period, the controller 3 controls the spin motor 14 to stop the rotation of the spin chuck 5 (rotation of the substrate W) (step T10). The processing (cleaning processing) of the single substrate W is thereby ended and the processed substrate W is carried out from the chamber 4 by the transfer robot (step T11).

By the above, with the present arrangement, the nozzle 6 having the plurality of discharge ports 31, 36, 41 and 46 is moved between the central portion processing position PC and the peripheral edge portion processing position PE. Also, the nozzle 6 is provided to be circumrotatable around the rotational axis A3. For a desired discharge port among the plurality of discharge ports 31, 36, 41 and 46, a distance between the discharge port and the rotational axis A1 can be changed by making the nozzle 6 circumrotate.

And, in a step in which a processing fluid is used, the rotation direction orientation of the nozzle 6 is controlled to be a predetermined orientation P1, P2, P3, or P4 where the discharge port to be used for discharge among the plurality of discharge ports 31, 36, 41 and 46 is separated further away from the rotational axis A1 than the other discharge ports at the peripheral edge portion processing position PE of the nozzle 6. In the orientation P1, P2, P3, or P4, the discharge port to be used for discharge faces the peripheral edge portion of the upper surface of the substrate W. Thereby, at the peripheral edge portion processing position PE of the nozzle 6, the desired discharge port among the plurality of discharge ports 31, 36, 41 and 46 can be made to face the peripheral edge portion of the upper surface of the substrate W, and thereby regardless of which discharge port among the plurality of discharge ports 31, 36, 41 and 46 of the nozzle 6 a processing fluid is discharged from, the processing fluid discharged from the discharge port can be supplied satisfactorily to the peripheral edge portion of the major surface of the substrate W.

Also, processing fluids of mutually different types are discharged from the plurality of discharge ports 31, 36, 41 and 46. Also, at the peripheral edge portion processing position PE of the nozzle 6, the desired discharge port among the plurality of discharge ports 31, 36, 41 and 46 can be made to face the peripheral edge portion of the upper surface of the substrate W.

And, in a step in which a processing fluid is used, the rotation direction orientation of the nozzle 6 is controlled, in accordance with the type of processing fluid to be discharged from the nozzle 6, to be a predetermined orientation P1, P2, P3, or P4 in which, at the peripheral edge portion processing position PE of the nozzle 6, the discharge port from which the processing fluid to be discharged faces the peripheral edge portion of the upper surface of the substrate W. Thereby, even in a case where a plurality of types of processing fluids are to be discharged from the nozzle 6, the processing fluid to be discharged can be supplied satisfactorily to the peripheral edge portion of the upper surface of the substrate W.

Also, with the present preferred embodiment, the plurality of discharge ports 31, 36, 41 and 46 are made mutually equal in distance from the rotational axis A1 and in each of the first to fourth orientations P1 to P4, the discharge port to be used for discharge is separated further away from the rotational axis A1 than the other discharge ports and disposed at a position on the locus X. That is, in each of the first to fourth orientations P1 to P4, the discharge port to be used for discharge is constant in relative position with respect to the substrate W. Thus, by setting the position of the discharge port to be used in processing (for example, the first discharge port 31) at the peripheral edge portion processing position PE to a position facing the peripheral region Ph of several mm width from the outer peripheral end of the substrate W in one rotation direction orientation (for example, the first orientation P1) among the first to fourth orientations P1 to P4, the processing fluid discharged from the discharge port can be supplied to the peripheral edge region with high precision.

FIG. 11 is a bottom view of a nozzle 6B included in a substrate processing apparatus according to another preferred embodiment of the present invention. FIGS. 12A to 12D are plan views for describing the rotation direction orientations of the nozzle 6B in steps in which the first to fourth processing fluids are used.

With the preferred embodiment shown in FIG. 11 and FIGS. 12A to 12D, portions corresponding to respective portions indicated in the preferred embodiment shown in FIG. 1 to FIG. 10 shall be provided with the same reference symbols as in FIG. 1 to FIG. 10 and description thereof shall be omitted.

A point in which the nozzle 6B according to the other preferred embodiment differs from the nozzle 6 according to the preferred embodiment described above is that the plurality of discharge ports (first discharge port 31B, second discharge port 36B, third discharge port 41B, and fourth discharge port 46B (hereinafter, these discharge ports may be referred to collectively as the "discharge ports 31B, 36B, 41B, and 46B")) formed in the lower surface 21a of the nozzle body 21 are mutually differed in distance from the rotational axis A1. The plurality of discharge ports 31B, 36B, 41B, and 46B are disposed at equal intervals in the circumferential direction.

Figure 12A:
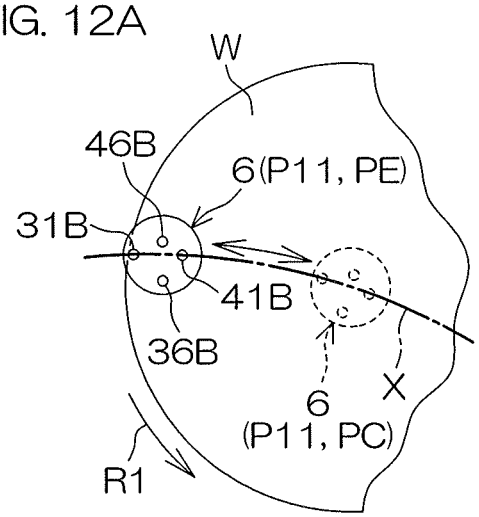
FIGS. 12A to 12D are plan views for describing the rotation direction orientations of the nozzle in steps in which the first to fourth processing fluids are used.
Figure 12B:
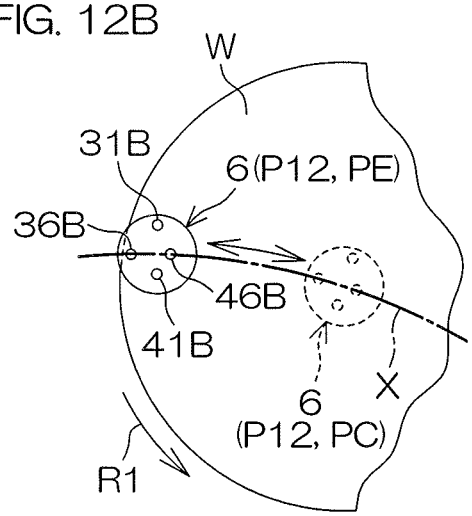
Figure 12C:
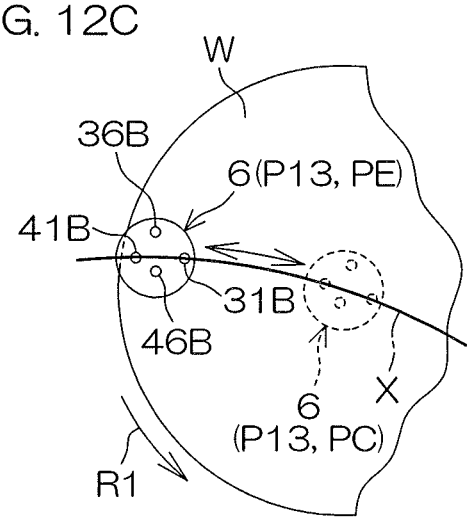
Figure 12D:
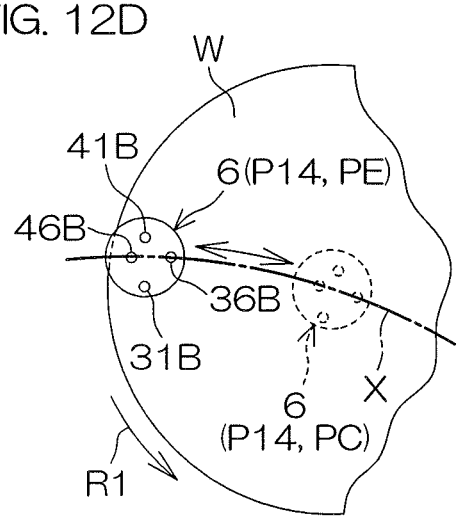

As in the preferred embodiment shown in FIG. 1 to FIG. 10, the nozzle circumrotating unit 24 switches the rotation direction orientation of the nozzle 6B among a total of four orientations of a first orientation P11 (orientation shown in FIG. 12A), a second orientation P12 (orientation shown in FIG. 12B), a third orientation P13 (orientation shown in FIG. 12C), and a fourth orientation P14 (orientation shown in FIG. 12D).

A first discharge port 31B is a discharge port corresponding to the above-described first discharge port 31 (see FIG. 3) and the first processing fluid is discharged from the first discharge port 31B. In a step in which the first processing fluid is discharged from the nozzle 6B (for example, the HF step (S3 or T3)), the nozzle 6B is in the first orientation P11. The first orientation P11 of the nozzle 6B is an orientation such that in a state where the nozzle 6B is disposed at the peripheral edge portion processing position PE, the supplying position of the first processing fluid from the first discharge port 31B is separated further away from the rotational axis A1 than the other discharge ports 36B, 41B, and 46B and the first discharge port 31B is positioned on the locus X.

A second discharge port 36B is a discharge port corresponding to the above-described second discharge port 36 (see FIG. 3) and the second processing fluid is discharged from the second discharge port 36B. In a step in which the second processing fluid is discharged from the nozzle 6B (for example, the rinsing step (S4, S6, T4, T6, or T8)), the nozzle 6B is in the second orientation P12. The second orientation P12 of the nozzle 6B is an orientation such that in the state where the nozzle 6B is disposed at the peripheral edge portion processing position PE, the supplying position of the second processing fluid from the second discharge port 36B is separated further away from the rotational axis A1 than the other discharge ports 31B, 41B, and 46B and the second discharge port 36B is positioned on the locus X.

A third discharge port 41B is a discharge port corresponding to the above-described third discharge port 41 (see FIG. 3) and the third processing fluid is discharged from the third discharge port 41B. In a step in which the third processing fluid is discharged from the nozzle 6B (for example, the SC1 step (S5 or T5)), the nozzle 6B is in the third orientation P13. The third orientation P13 of the nozzle 6B is an orientation such that in the state where the nozzle 6B is disposed at the peripheral edge portion processing position PE, the supplying position of the third processing fluid from the third discharge port 41B is separated further away from the rotational axis A1 than the other discharge ports 31B, 36B, and 46B and the third discharge port 41B is positioned on the locus X.

A fourth discharge port 46B is a discharge port corresponding to the above-described fourth discharge port 46 (see FIG. 3) and the fourth processing fluid is discharged from the fourth discharge port 46B. In a step in which the fourth processing fluid is discharged from the nozzle 6B (for example, the spin drying step (S7) or the SC2 step (T7)), the nozzle 6B is in the fourth orientation P14. The fourth orientation P14 of the nozzle 6B is an orientation such that in the state where the nozzle 6B is disposed at the peripheral edge portion processing position PE, the supplying position of the fourth processing fluid from the fourth discharge port 46B is separated further away from the rotational axis A1 than the other discharge ports 31B, 36B, and 41B and the fourth discharge port 46B is positioned on the locus X.

Also, in the present preferred embodiment, the second discharge port 36B is made shorter in distance from the rotational axis A1 than the first discharge port 31B. The third discharge port 41B is made shorter in distance from the rotational axis A1 than the second discharge port 36B. The fourth discharge port 46B is made shorter in distance from the rotational axis A1 than the third discharge port 41B. Therefore, at the peripheral edge portion processing position PE of the nozzle 6B, the discharge ports to be used for discharge in the first to fourth orientations P11 to P14 are differed mutually in relative position with respect to the substrate W.

Figure 13:
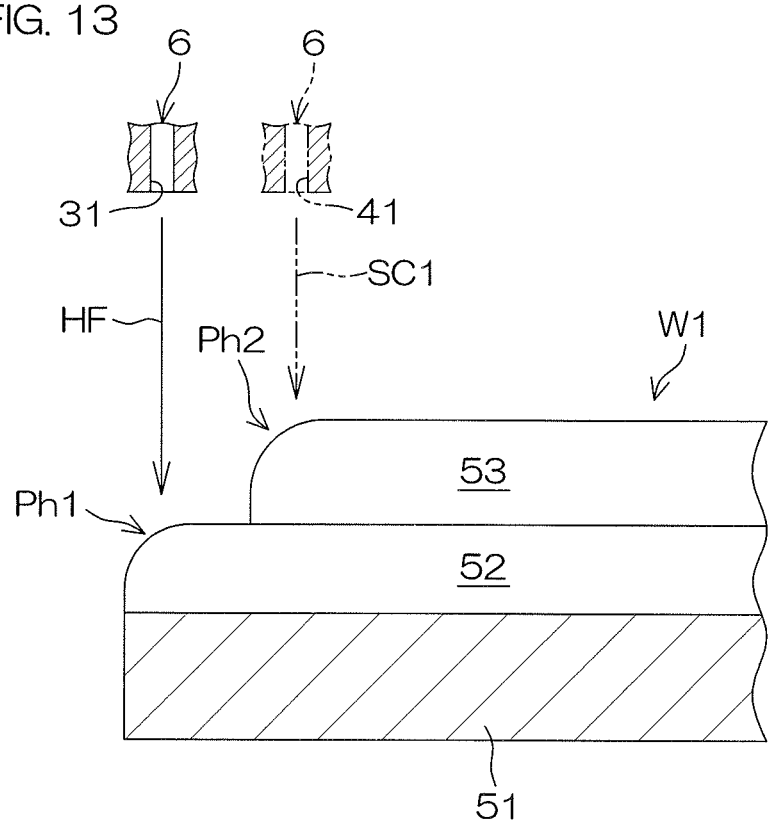
FIG. 13 is a sectional view for describing a substrate processing example performed by the substrate processing apparatus.

FIG. 13 is a sectional view for describing a substrate processing example performed by the substrate processing apparatus that includes the nozzle 6B.

As a substrate to be processed, a substrate W1 is assumed with which an $SiO_2$ film 52 covering an upper surface of a silicon substrate 51 is disposed on the upper surface, and a TiN film 53 covering an upper surface of the $SiO_2$ film 52 is disposed on the upper surface. In this case, at a peripheral edge portion of an upper surface of the substrate W1, a position at which a processing fluid (for example, hydrofluoric acid) is desired to be supplied to the $SiO_2$ film 52 and a position at which a processing fluid (for example, SC1) is desired to be supplied to the TiN film 53 may differ mutually in regard to a radial direction of the substrate W1 as shown in FIG. 13. The substrate W1 is processed using the first substrate processing example (see FIG. 5) or the second substrate processing example (see FIG. 10).

In each of the first and second substrate processing examples, cleaning such that the $SiO_2$ film 52 is removed by etching is performed in the HF step (S3 or T3) and cleaning such that the TiN film 53 is removed by etching is performed in the SC1 step (S5 or T5).

In the HF step (S3 or T3), the controller 3 controls the nozzle moving unit 8 to swing the nozzle arm 7 and move the nozzle 6B between the central portion processing position PC (position indicated by broken lines in FIG. 12A) and the peripheral edge portion processing position PE (position indicated by solid lines in FIG. 12A). A liquid landing position of the hydrofluoric acid with respect to the upper surface of the substrate W1 is thereby moved along the locus X, between a central portion of the upper surface of the substrate W1 and the peripheral edge portion of the upper surface. In this process, at the peripheral edge portion processing position PE of the nozzle 6B, the hydrofluoric acid discharged from the first discharge port 31B (the hydrofluoric acid discharged from the nozzle 6B) lands on a first peripheral edge region Ph1 of the upper surface of the substrate W1.

In the SC1 step (S5 or T5), the controller 3 controls the nozzle moving unit 8 to swing the nozzle arm 7 and move the nozzle 6B between the central portion processing position PC (position indicated by broken lines in FIG. 12C) and the peripheral edge portion processing position PE (position indicated by solid lines in FIG. 12C). A liquid landing position of the SC1 with respect to the upper surface of the substrate W1 is thereby moved along the locus X, between the central portion of the upper surface of the substrate W and the peripheral edge portion of the upper surface. In this process, at the peripheral edge portion processing position PE of the nozzle 6B, the SC1 discharged from the third discharge port 41B (the SC1 discharged from the nozzle 6B) lands on a second peripheral edge region Ph2, which is adjacent, at a further inner side, to the first peripheral edge region Ph1.

By the above, with the present preferred embodiment, in addition to actions and effects similar to the actions and effects described for the above-described preferred embodiment shown in FIG. 1 to FIG. 10, at the peripheral edge portion processing position PE of the nozzle 6, the supplying position of a processing fluid discharged from the discharge port to be used for discharge can be differed by just a minute amount in accordance with the processing fluid.

Although two preferred embodiments of the present invention were described above, the present invention may be implemented in yet other modes.

For example, in the second preferred embodiment, it is not necessary for all of the discharge ports of the plurality of discharge ports 31B, 36B, 41B, and 46B to be mutually different in distance from the rotational axis A3, and it suffices that one of the discharge ports among the plurality of discharge ports 31B, 36B, 41B, and 46B differ from the other discharge ports in distance from the rotational axis A3.

Also, although with each of the preferred embodiments described above, the nozzle 6 or 6B having the plurality of discharge ports has the arrangement where the plurality of discharge ports are provided in the single nozzle body 21, it may be instead be arranged by providing a plurality of nozzle bodies, each having a predetermined number (for example, one) of discharge ports.

Also, although with each of the preferred embodiments described above, each discharge port is described as a discharge port discharging a processing fluid vertically downward, an arrangement is also possible where a processing fluid is discharged obliquely downward from each discharge port.

Also, with each of the preferred embodiments described above, the number of discharge ports provided in the nozzle 6 or 6B may be two or three or five or more instead of four.

Also, although with each of the preferred embodiments described above, the case where one nozzle arm 7 that includes the nozzle 6 or 6B is included was taken up as an example, two or more nozzle arms 7, each including the nozzle 6 or 6B, may be included instead.

Also, although the arrangement where the nozzle moving unit 8 swings the nozzle 6 or 6B around the swinging axis A2 was taken up as an example, an arrangement that moves the nozzle 6 or 6B rectilinearly in a horizontal direction may be adopted instead.

Also, as the process fluid supplying unit 9, an example where processing fluids of mutually different types are supplied to the plurality of discharge ports was described, the processing fluids supplied to the plurality of discharge ports may be of the same type instead. In this case, the temperature of the processing fluid may be differed according to each of the plurality of discharge ports.

Also, although with each of the preferred embodiments described above, the case where the substrate processing apparatus 1 is an apparatus that processes the disk-shaped substrate W or W1 is described, the substrate processing apparatus 1 may instead be an apparatus that processes a polygonal substrate, such as a glass substrate for a liquid crystal display device, etc.

While preferred embodiments of the present invention have been described in detail, these are merely specific examples used to clarify the technical contents of the present invention and the present invention should not be interpreted as being limited to these specific examples and the scope of the present invention are to be limited only by the appended claims.

The present application corresponds to Japanese Patent Application No. 2016-11885 filed on Jan. 25, 2016 in the Japan Patent Office, and the entire disclosure of this application is incorporated herein by reference.

REFERENCE SIGNS LIST

1: Substrate processing apparatus
3: Controller (first and second orientation controllers)
5: Spin chuck (substrate holding unit)
6: Nozzle
6B: Nozzle
7: Nozzle arm
8: Nozzle moving unit
9: Processing fluid supplying unit
24: Nozzle circumrotating unit
31: First discharge port
31B: First discharge port
36: Second discharge port
36B: Second discharge port
41: Third discharge port
41B: Third discharge port
46: Fourth discharge port
46B: Fourth discharge port
A1: Rotational axis (first rotational axis)
A3: Rotational axis (second rotational axis)
PC: Central portion processing position
PE: Peripheral edge portion processing position
W: Substrate
W1: Substrate

The invention claimed is:

1. A substrate processing apparatus comprising:
a substrate holder that holds a substrate;
a spin motor that causes the substrate to rotate, held by the substrate holder around a predetermined first rotational axis passing through a central portion of a major surface of the substrate;
a nozzle, provided to be circumrotatable around a predetermined second rotational axis, that discharges a processing fluid toward the major surface of the substrate, and having a plurality of discharge ports disposed at positions separated from the second rotational axis;
a nozzle arm supporting the nozzle;
a discharge port changer that causes the nozzle to circumrotate around the second rotational axis to change the discharge port to be used;
a processing fluid supplying unit, including a processing fluid supplying piping connected to the plurality of discharge ports, that supplies the processing fluid to the plurality of discharge ports; and
a nozzle mover that moves the nozzle arm to move the nozzle between a central portion processing position, at which the processing fluid discharged from the nozzle is supplied to the central portion of the major surface of the substrate, and a peripheral edge portion processing position, at which the processing fluid discharged from the nozzle is supplied to the peripheral edge portion of the major surface of the substrate,
wherein the plurality of discharge ports are disposed at positions that are mutually different in distance from the second rotational axis.

2. The substrate processing apparatus according to claim 1, wherein the processing fluid supplying unit has a plurality of fluid supplying pipings connected for supplying respective processing fluids of mutually different types to the plurality of discharge ports.

3. The substrate processing apparatus according to claim 2, further comprising: a first orientation controller that controls a rotation direction orientation of the nozzle by the discharge port changer in accordance with a type of processing fluid to be discharged from the nozzle.

4. The substrate processing apparatus according to claim 1, further comprising: a second orientation controller that controls the rotation direction orientation of the nozzle by the discharge port changer such that at the peripheral edge portion processing position, a discharge port to be used for discharge among the plurality of discharge ports is disposed at a position at which it is separated further away from the first rotational axis than the other discharge ports.

5. The substrate processing apparatus according to claim 1, wherein the plurality of discharge ports are disposed mutually different in distance from the first rotational axis.

6. A substrate processing method comprising:
a step of preparing a nozzle, provided to be circumrotatable around a predetermined second rotational axis passing through a major surface of a substrate held by a substrate holder, that discharges a processing fluid toward the major surface of the substrate, and that has a plurality of discharge ports disposed at positions separated from the second rotational axis;

a nozzle moving step of moving the nozzle along the major surface of the substrate between a central portion processing position of facing a central portion of the major surface of the substrate and a peripheral edge portion processing position of facing a peripheral edge portion of the major surface of the substrate; and an orientation controlling step of making the nozzle circumrotate around the second rotational axis to control a rotation direction orientation of the nozzle in accordance with a type of processing fluid to be discharged from the nozzle, wherein the plurality of discharge ports are disposed at positions that are mutually different in distance from the second rotational axis.

7. The substrate processing method according to claim 6, wherein the orientation controlling step includes a step of making the nozzle circumrotate around the second rotational axis to control the rotation direction orientation of the nozzle such that a discharge port to be used for discharge among the plurality of discharge ports is disposed at a position at which it is separated further away from a central portion of the major surface of the substrate than the other discharge ports.

8. The substrate processing apparatus according to claim 1, wherein the processing fluid supplying unit has sources connected for supplying respective processing fluids of different types including an etching liquid, a rinse liquid and a cleaning liquid.

9. The substrate processing apparatus according to claim 8, wherein the plurality of discharge ports includes a first discharge port, a second discharge port disposed closer to the second rotational axis than the first discharge port, and a third discharge port disposed closer to the second rotational axis than the second discharge port, and the processing fluid supplying unit supplies the etching liquid to the first discharge port, supplies the rinse liquid to the second discharge port, and supplies the cleaning liquid to the third discharge port.

10. The substrate processing method according to claim 6, further comprising a step of supplying processing fluids of different types including an etching liquid, a rinse liquid and a cleaning liquid to the plurality of discharge ports, respectively.

11. The substrate processing method according to claim 10, wherein the plurality of discharge ports includes a first discharge port, a second discharge port disposed closer to the second rotational axis than the first discharge port, and a third discharge port disposed closer to the second rotational axis than the second discharge port, and the processing fluid supplying step supplies the etching liquid to the first discharge port, supplies the rinse liquid to the second discharge port, and supplies the cleaning liquid to the third discharge port.

* * * * *